United States Patent
Huang

(10) Patent No.: US 6,839,230 B2
(45) Date of Patent: Jan. 4, 2005

(54) HEAT DISSIPATING DEVICE OF AN EXTRACTABLE DISK DRIVE

(76) Inventor: Cheng Yu Huang, 4 F, 4, Lane 6, Alley 48, Cheng Chang St., Hsinchung, Taipei Hsien (TW)

( * ) Notice: Subject to any disclaimer, the term of this patent is extended or adjusted under 35 U.S.C. 154(b) by 594 days.

(21) Appl. No.: 09/975,156

(22) Filed: Oct. 12, 2001

(65) Prior Publication Data

US 2002/0105782 A1 Aug. 8, 2002

(30) Foreign Application Priority Data

Feb. 8, 2001 (CN) .......................................... 01259614
Sep. 2, 2001 (TW) ......................................... 90201934

(51) Int. Cl.[7] ................................................ H05K 7/20
(52) U.S. Cl. .................... 361/687; 361/784; 312/223.2; 364/708.1
(58) Field of Search ................................ 361/724–727, 361/679–687, 730, 735, 784, 785; 439/64–65; 312/223.2; 710/1, 100; 165/121, 80.3; 364/708.1

(56) References Cited

U.S. PATENT DOCUMENTS 5,917,706 A * 6/1999 Steffen ........................ 361/773
5,949,645 A * 9/1999 Aziz et al. ................... 361/695
6,556,440 B2 * 4/2003 Jensen et al. ................ 361/687

* cited by examiner

Primary Examiner—Hung Van Duong
(74) Attorney, Agent, or Firm—Troxell Law Office PLLC

(57) ABSTRACT

A heat-dissipating device of an extractable disk drive capable of being mounted to a mainframe of a personal computer or a servo is disclosed. The extractable disk drive box has a preferred heat dissipating effect. In the present invention, the casing of the disk drive for mounting the extractable disk drive is designed as a large space for convection. Cold air is absorbed from the front end and lateral sides of the disk drive casing and then hot air is exhausted from the rear side so as to have a preferred heat dissipating effect.

4 Claims, 5 Drawing Sheets

HEAT DISSIPATING DEVICE OF AN EXTRACTABLE DISK DRIVE

BACKGROUND OF THE INVENTION

1. Field of the Invention

The present invention relates to heat dissipation, and particularly to a heat-dissipating device of an extractable disk drive

2. Description of Related Art

Due to the development of computer science, the operation speed of computers is increased rapidly. Thereby, the heat dissipated is also increased rapidly with the operation speed. The main heat sources of computers include CPUs, power supplies, and hard disk drives, wherein the hard disk drive is especially important. Therefore, it is necessary to retain the temperature of a hard disk drive in an operation range. Particularly, extractable disk drive boxes are frequently used, while they are not preferred in heat dissipation.

Currently, most of the hard disk drive is extractable. In general, the heat dissipation of hard disk drive is performed by a plurality of small fans installed at the front or rear sides of a disk drive U shape interior supporting seat 2 (in general, they are divided into a front extracting type, a rear extracting type, and front and rear extracting type. In the front extracting type, fans are installed at the front center of the seat, and for the rear extracting type; fans are installed at distal end of the seat). In the prior art, air channels are formed between the U shape interior supporting seat and the hard disk drive. Sometimes no air channel is left. Fans are added at the front (front extracting type) or the rear (rear extracting type) sides. Thereby, air may flow through the channels to induce heat convention effect. However, this prior design is confined by the hard disk drive and the space and thus the heat-dissipating device is not preferred.

SUMMARY OF THE INVENTION

Accordingly, the primary object of the present invention is to provide a heat-dissipating device of an extractable disk drive capable of being mounted to a mainframe of a personal computer or a servo. The extractable disk drive box has a preferred heat dissipating effect. In the present invention, the casing of the disk drive for mounting the extractable disk drive is designed as a large space for convection. Cold air is absorbed from the front end and lateral sides of the disk drive casing and then hot air is exhausted from the rear side so as to have a preferred heat dissipating effect.

The various objects and advantages of the present invention will be more readily understood from the following detailed description when read in conjunction with the appended drawing.

DETAILED DESCRIPTION OF THE PREFERRED EMBODIMENTS

Figure 1:
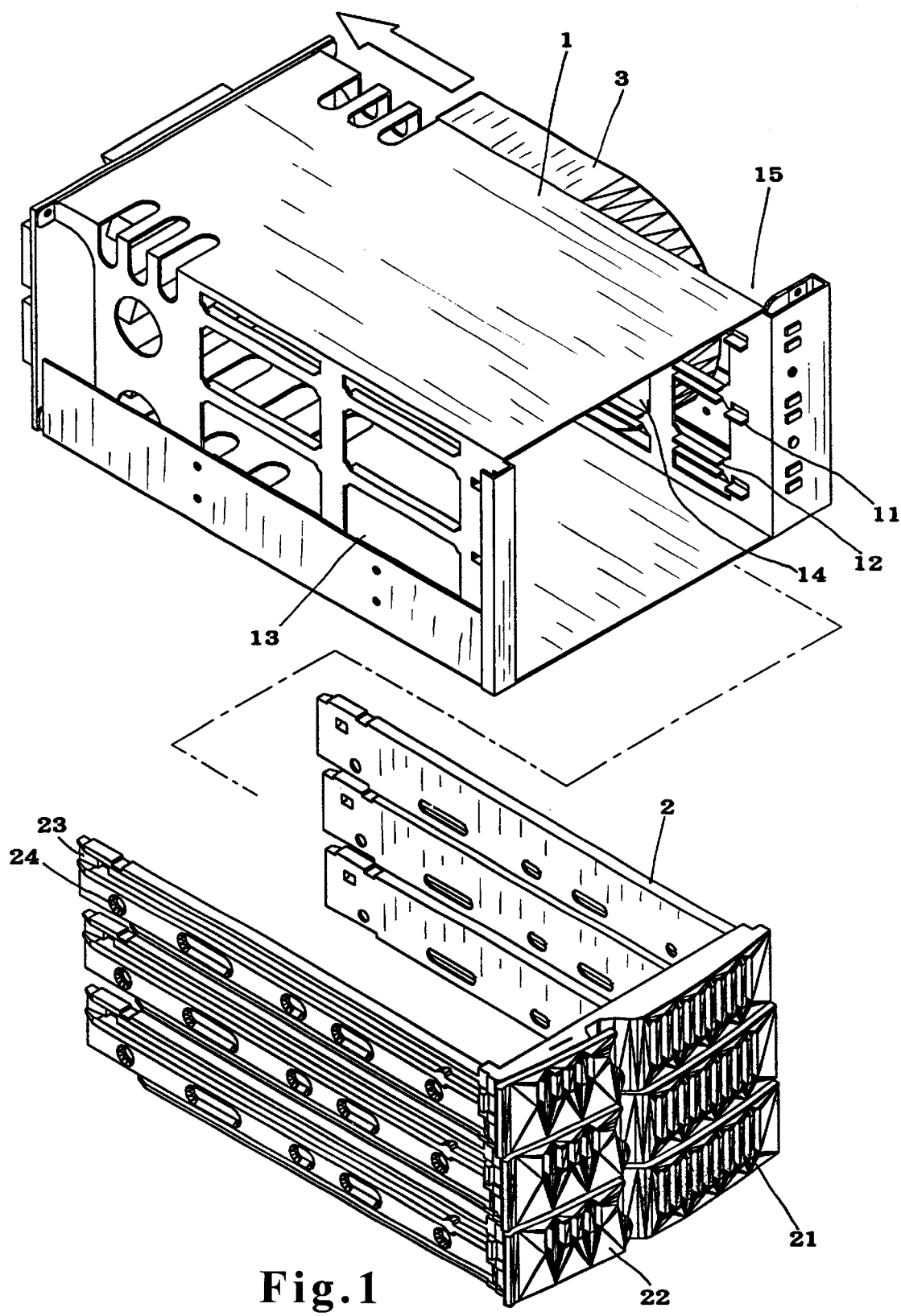
FIG. 1 shows an exploded perspective view of the computer extractable disk drive box and the U shape interior-supporting seat thereof according to the present invention.

Referring to FIG. 1, an exploded perspective view of the extractable disk drive box and the U shape interior-supporting seat of the present invention are illustrated. The present invention mainly includes an extractable disk drive box 1, a U shape interior supporting seat 2, and a fan 3. The U shape interior-supporting seat 2 serves to fix a hard disk drive. The front side of each U shape interior-supporting seat 2 is formed with a plurality of air vents 21. The front panel thereof is installed with handles 22. Two sides thereof are formed with sliding grooves 23 and thread holes 24.

Figure 2:
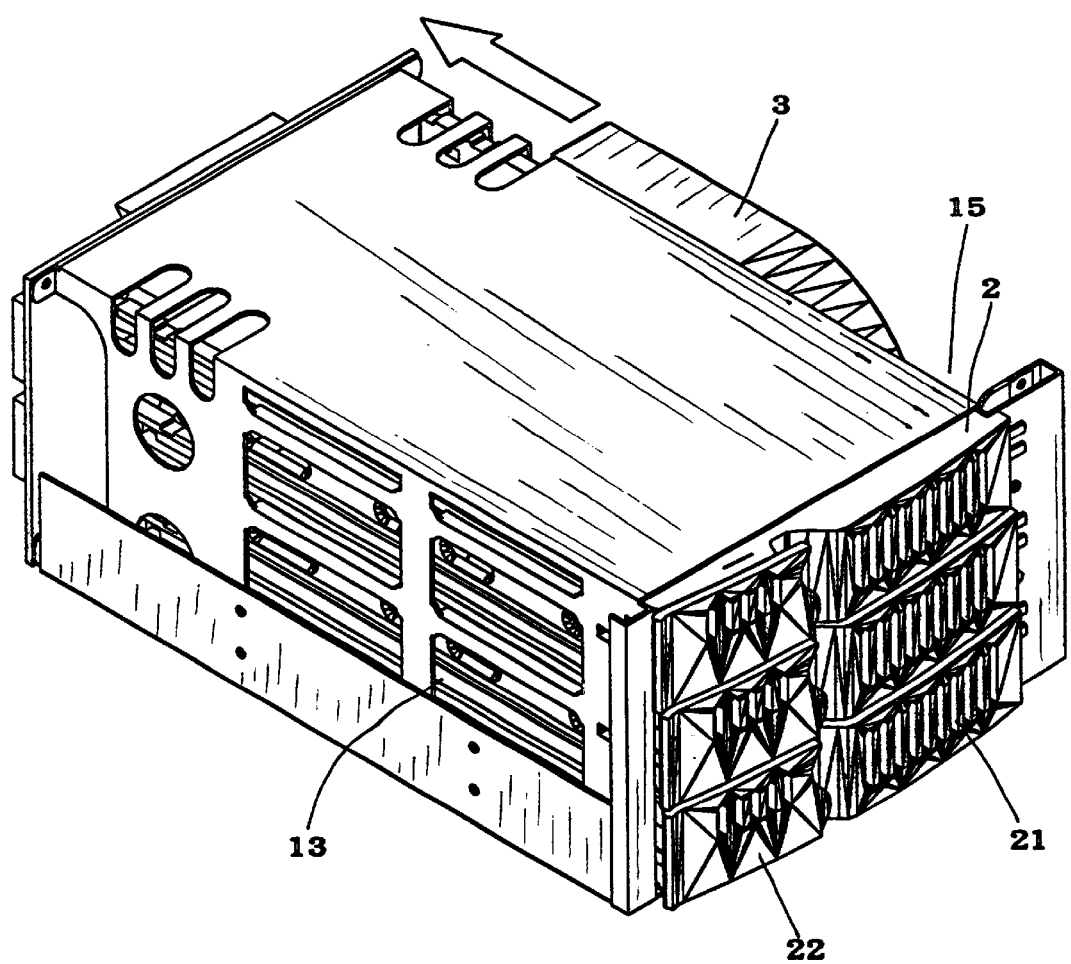
FIG. 2 is a schematic perspective view of the computer extractable disk drive box and the U shape interior-supporting seat thereof according to the present invention.

Referring to FIGS. 1 and 2, the extractable disk drive box 1 is fixed to a computer disk drive frame. The two sides of the inner space are formed with sliding tracks 11 and supporting plates 12. The supporting plates 12 at two sides have slots 13, 14 so that air may flow through the slots. One side thereof has a receiving space 15. A fan can be placed in that space 15. The blower type larger fan 3 absorbing air from lateral sides and exhausting air from the rear side may be fixed to the receiving space 15.

In above structure, when the computer is being used and the fan 3 is actuated, a large amount of cold air is absorbed from the vents 21 in the U shape interior-supporting seat 2 of the extractable disk drive box 1. Meanwhile, the slots 13 at the lateral sides can absorb air and then the air uniformly flow a hard disk drive in the U shape interior-supporting seat 2. Then heat is dissipated out from the slot 14 to the rear side by using the fan 3 along a direction indicated by the arrow in the drawing. Thereby, a predetermined heat dissipating effect is achieved.

Figure 3:
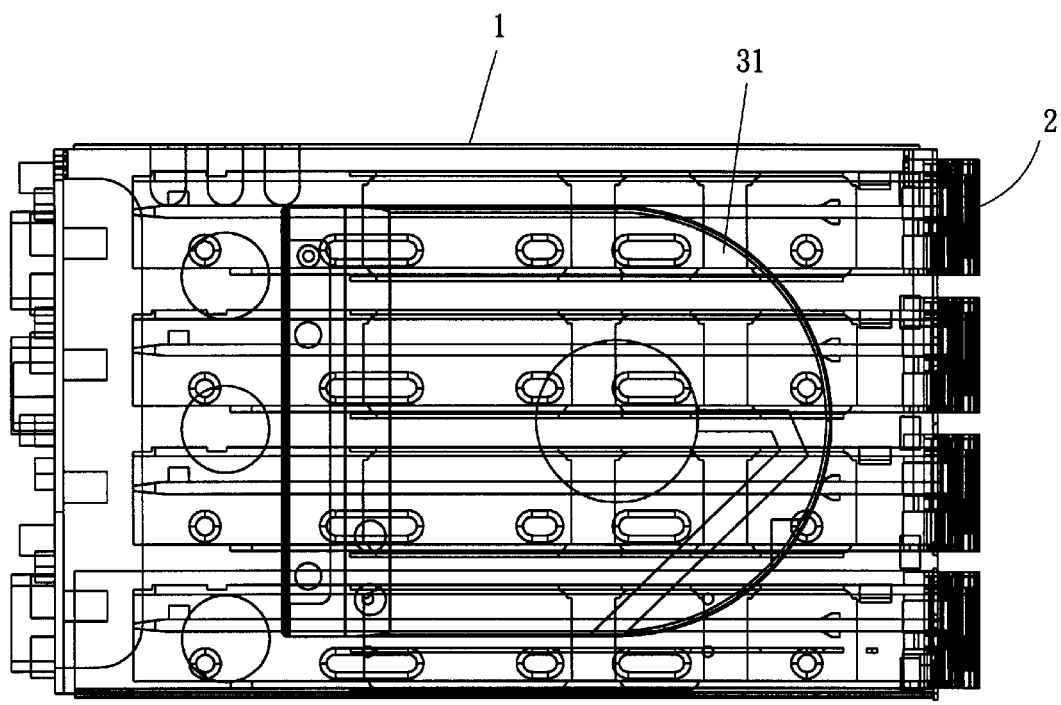
FIG. 3 is a side view showing that the computer extractable disk drive box of the present invention is mounted with four U shape interior supporting seats.
Figure 4:
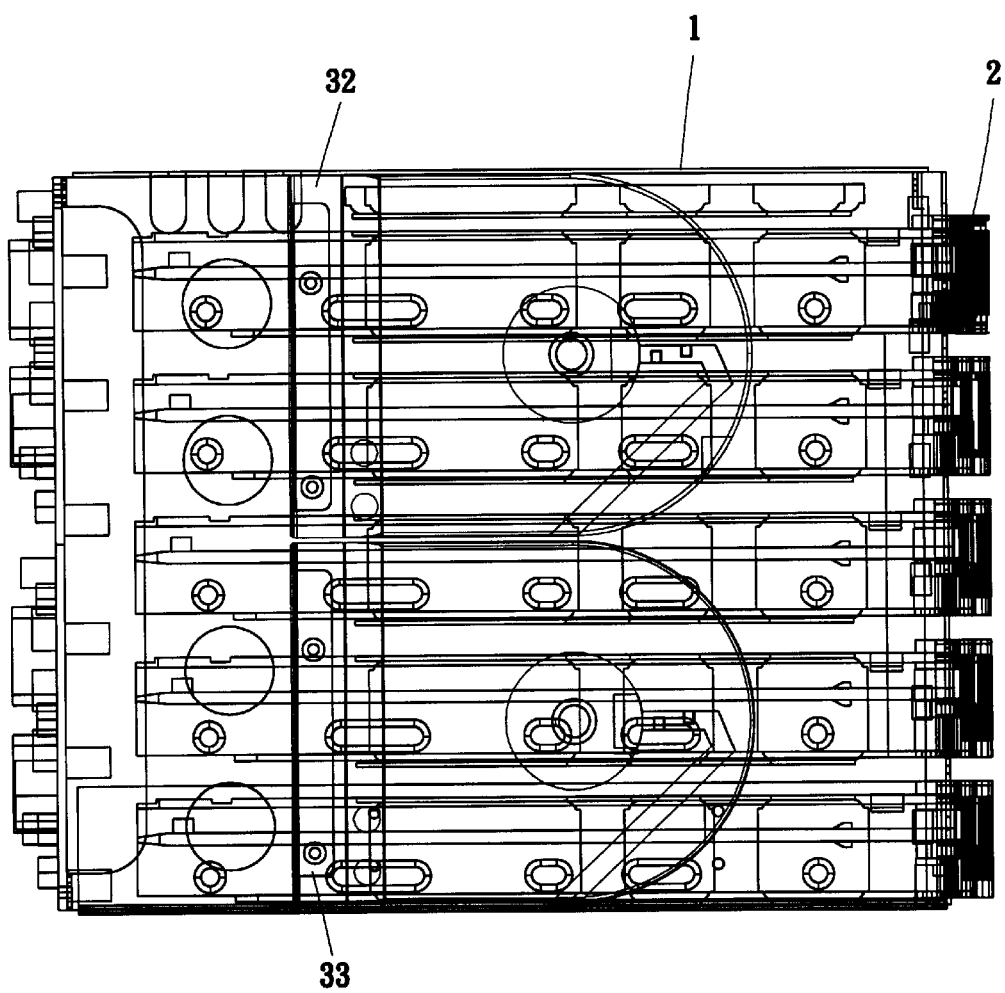
FIG. 4 is a side view showing that the computer extractable disk drive box of the present invention is mounted with at least four U shape interior supporting seats, wherein the disk drive fans are arranged in parallel at the upper and lower sides

Referring to FIG. 3, according to the heat dissipating principle of the present invention, the present invention can be used in an extractable disk drive box 1 with four U shape interior supporting seats 2. A larger fan 3 can be installed at the lateral side thereof, as shown in FIG. 4. In the present invention, as the number of the U shape interior supporting seats 2 in the extractable disk drive box 1 is over 4, then fans 32, 33 can be arranged at the upper and lower sides so as to have a preferred heat dissipating effect.

Figure 5:
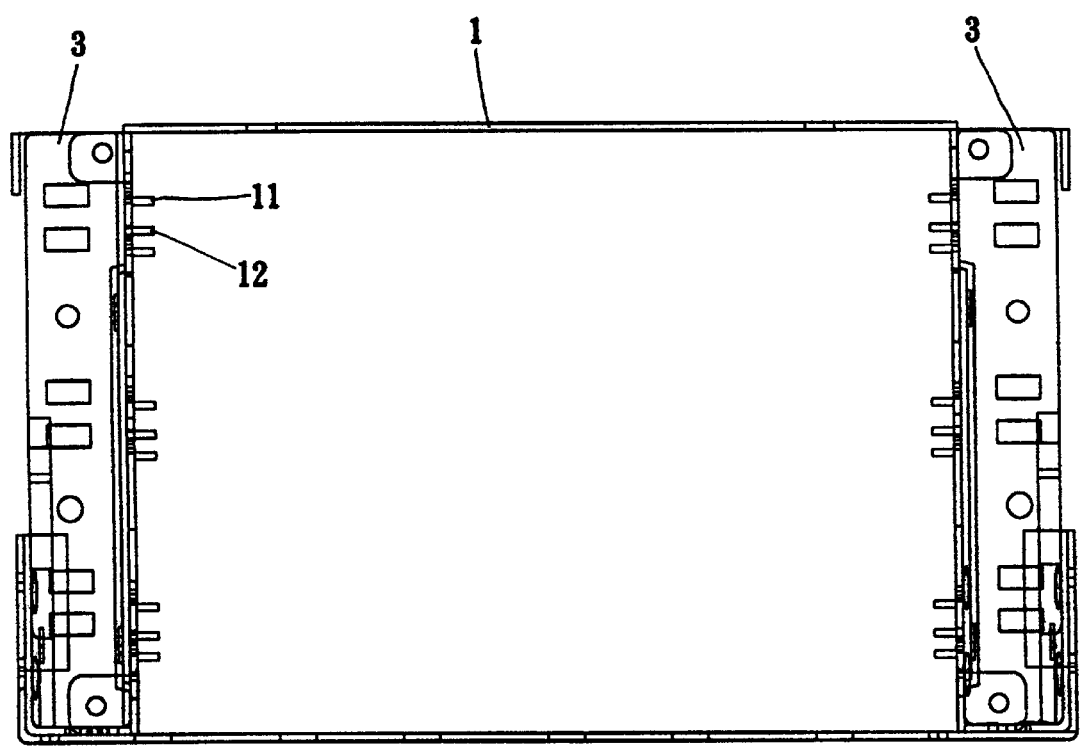
FIG. 5 is a front view showing that the heat dissipating fans of the present invention are installed at two sides of an extractable disk drive box.

With reference to FIG. 5, in the application of the present invention, the fans 3 are disposed at two side of the extractable disk drive box 1, in that the thickness of the fan 3 is only one half of the original one. The two sides of the extractable disk drive box 1 are formed with a fan receiving space 15. Thereby, a large convection heat dissipating space is formed. Cold air out of the disk drive (containing air at the lateral sides) is absorbed from the front side of the casing of the disk drive. Then, the air is extracted from the fans at two sides and then is exhausted towards the rear sides so as to have an optimum heat dissipating effect.

The present invention are thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipating device of an extractable disk drive comprising:

An extractable disk drive box; two sides of the inner space thereof being formed with sliding tracks and supporting plates which are symmetric to two side of one of a plurality of U shape interior supporting seat; the supporting plates at two sides have slots so that air can flow through the slots; one side thereof has a receiving space; and a fan can be placed in that space; a blower type larger fan absorbing air from lateral sides and exhausting air from rear side being fixed to the receiving space; and the plurality of U shape interior supporting seats for fixing a hard disk drive; adjacent U shape interior supporting seats being formed with a space, thereby, air flowing through the space; a handle being installed at a front panel of the U shape interior supporting seat; two sides of the U shape interior supporting seat having sliding grooves and screw holes;

a blower type large fan being fixed to the receiving space at lateral sides thereof; as the fan is operation, a large amount of outer cold air will be absorbed from vents at the front side of the extractable disk drive box, and the same time, slots at the lateral sides of the extractable disk drive box also absorbs air; the air flowing uniformly through a hard disk drive in the U shape interior supporting seat, and then heat being exhausted from the slots at another side of the extractable disk drive box.

2. The heat dissipating device of an extractable disk drive as claimed in claim 1, wherein the extractable disk drive box is installed with four U shape interior supporting seats; and the lateral side thereof is installed with a larger fan.

3. The heat dissipating device of an extractable disk drive as claimed in claim 1, wherein the extractable disk drive box is installed with at least four U shape interior supporting seats; and the lateral side thereof is installed with plurality of fans.

4. The heat dissipating device of an extractable disk drive as claimed in claim 1, wherein the fans are disposed at two sides of the extractable disk drive box, in that the thickness of the fan is only one half of the original one; the two sides of the extractable disk drive box are formed with fan receiving spaces.

* * * * *